United States Patent [19]

Takenaka

[11] Patent Number: 5,724,287
[45] Date of Patent: Mar. 3, 1998

[54] DATA INPUT CIRCUIT OF SEMICONDUCTOR STORAGE DEVICE

[75] Inventor: Tetsuro Takenaka, Tokyo, Japan

[73] Assignee: Oki Electric Industry Co., Ltd., Tokyo, Japan

[21] Appl. No.: 651,716

[22] Filed: May 22, 1996

[30] Foreign Application Priority Data

May 25, 1995 [JP] Japan ................................. 7-126088

[51] Int. Cl.⁶ .................................................. H03K 5/153
[52] U.S. Cl. ........................ 365/191; 326/93; 365/194
[58] Field of Search ............................ 365/191, 194; 326/82, 86, 93, 104

[56] References Cited

U.S. PATENT DOCUMENTS 5,555,526  9/1996  Kim ................................... 365/191 X
5,559,752  9/1996  Stephens, Jr. et al. ............. 365/194 X
5,606,269  2/1997  Pontius et al. ..................... 326/93
5,619,157  4/1997  Kumata et al. ..................... 326/93 X

*Primary Examiner*—David R. Hudspeth

[57] ABSTRACT

In a data input circuit of a semiconductor storage device, when a write control signal is changed to a write enable state or when write data changes during the write control signal being in the write enable state, a write pulse is generated in one of first and second write pulse data depending on a logical level of the write data. The first and second write pulse data are obtained by first forming intermediate first and second write pulse data based on the write control signal and the write data and then by executing logical operations between the intermediate first and second write pulse data and the write data so as to form final first and second write pulse data. The final first and second write pulse data are given to a pair of data lines, respectively.

6 Claims, 6 Drawing Sheets

DATA INPUT CIRCUIT OF SEMICONDUCTOR STORAGE DEVICE

BACKGROUND OF THE INVENTION

1. Field of the Invention

The present invention relates to a data input circuit of a semiconductor storage device having a write function.

2. Description of the Prior Art

There have been proposed those semiconductor storage devices, wherein write data is converted to a pulse having a pulse width approximate to a minimum time which can achieve a write operation of a memory cell, so as to shorten a write time for reduction of power consumption upon writing.

FIG. 8 shows a data input circuit in the conventional semiconductor storage device having such a pulsing function for the write data. Hereinafter, "symbols with an upper bar" in the drawings will be identified by "symbols with / (slash) at the end thereof" in the specification.

In FIG. 8, an active-low chip select signal CS/ and an active-low write enable signal WE/ are inputted to a two-input NOR gate 1. When the chip select signal CS/ and the write enable signal WE/ are both "L (low)" (active), the NOR gate 1 outputs a signal "H (high)" indicative of instructions to write. The "H" signal from the NOR gate 1 is inputted to one of input terminals of each of two-input AND gates 2 and 3. Input data DIN is inverted and inputted to the other input terminal of the AND gate 2, while the input data DIN is directly (not inverted) inputted to the other input terminal of the AND gate 3. Thus, upon writing, the AND gate 2 outputs an inverted logical level of the input data DIN, while the AND gate 3 outputs a logical level of the input data DIN as it is.

The signal from the AND gate 2 is directly inputted to one of input terminals of a two-input NAND gate 6. Simultaneously, the signal from the AND gate 2 is fed to a delay circuit 4 where the inputted signal is delayed by a given time. The delayed signal is further inverted and then given to the other input terminal of the NAND gate 6. The NAND gate 6 outputs first write pulse data WD for feeding to one of a pair of data lines. The first write pulse data WD takes a "L" level for a given time (pulse width) as determined by the given delay time achieved by the delay circuit 4. The NAND gate 6 takes such a "L" level immediately after the chip select signal CS/ and the write enable signal WE/ both change to "L" while the input data DIN is "L", or immediately after the input data DIN changes from "H" to "L" while the chip select signal CS/ and the write enable signal WE/ are both "L".

Accordingly, the delay circuit 4 and the NAND gate 6 cooperatively work to detect a trailing edge of a signal whose active level is set to "L".

Similarly, the signal from the AND gate 3 is also formed in a pulse signal by means of a delay circuit 5 and a NAND gate 7. The NAND gate 7 outputs second write pulse data WD/ for feeding to the other of the pair of data lines. The second write pulse data WD/ takes a "L" level for a given time (pulse width) as determined by a given delay time achieved by the delay circuit 5. The NAND gate 7 takes such a "L" level immediately after the chip select signal CS/ and the write enable signal WE/ both change to "L" while the input data DIN is "H", or immediately after the input data DIN changes from "L" to "H" while the chip select signal CS/ and the write enable signal WE)/are both "L".

However, in the foregoing conventional semiconductor storage device, when the logical level of the input data changes during the writing operation, it is possible that, due to, for example, a timing lag caused by difference in number of the gates in the pulse-forming circuits or wiring-pattern loads of the pair of data lines for transmitting the first and second write pulse data WD and WD/, deviation, rounding or overlapping of the first and second write pulse data occurs on those data lines. This may disable the data from being correctly written in the memory cells. Particularly, in case of the high-speed operated semiconductor storage device, since pulse widths of the pulse data are set smaller, it is liable to be adversely affected by the deviation, rounding or overlapping of the first and second write pulse data WD and WD/.

FIG. 9 shows a timing chart for explaining the foregoing drawback. In the figure, as shown at (A) and (B) in FIG. 9, the input data DIN is "H" when the output signal of the NOR gate 1 changes to "H" to allow writing of the input data, that is, for example, when the write enable signal WE/ changes to "L" while the chip select signal CS/ is "L". Thus, as shown at (C) in FIG. 9, a pulse is generated only in the second write pulse data WD/ for writing the input data "H" in a memory cell. As further shown at (B) in FIG. 9, the input data DIN changes from "H" to "L" at a time point with a lapse of a relatively short time T1 from a time point where the output of the NOR gate 1 changes to "H", that is, where the write enable signal WE/ changes to "L". Thus, as shown at (D) in FIG. 9, a pulse is generated only in the first write pulse data WD for writing the input data "L" in a memory cell.

In the example shown in FIG. 9, however, if a time T1 is so short, a time period of the pulse in the second write pulse data WD/ for writing the data "H" in the memory cell and a time period of the pulse in the first write pulse data WD for writing the data "L" in the memory cell overlap with each other during a time T2 as shown at (C) and (D) in FIG. 9 due to the foregoing factors. As a result, a time period of a logical combination of "H" and "L" of the pair of write pulse data WD and WD/ for first writing the data "H" becomes short, and further, a time period of a logical combination of "L" and "H" of the pair of write pulse data WD and WD/ for subsequently writing the data "L" also becomes short so that the data can not be correctly written in the memory cells.

In the foregoing example, since the subsequent writing of the data "L" has, in general, a significant meaning, the fact that the subsequent data "L" can not be correctly written is particularly serious.

In practice, there are various kinds of devices, such as CPU's, which utilize the semiconductor storage devices. For example, a device of one type renders the write enable signal WE/ active after changing the write data DIN, while a device of another type changes the write data DIN after changing the write enable signal WE/ to be active. The foregoing drawback as explained using FIG. 9 tends to occur when the semiconductor storage device is connected to the latter device.

As appreciated, the drawback similarly occurs when a logical level of the input data changes in plural times during the writing operation period.

Further, if pulse widths of the first and second write pulse data WD and WD/ are insufficient or rounding of pulses occurs in the write pulse data, resetting of the data lines or bit lines for allowing reading of the data also becomes indefinite so that the operation of the semiconductor storage device is made unreliable also from this aspect.

SUMMARY OF THE INVENTION

Therefore, it is an object of the present invention to provide an improved data input circuit of a semiconductor storage device.

According to one aspect of the present invention, a data input circuit of a semiconductor storage device, wherein when a write control signal is changed to a write enable state or when write data changes during the write control signal being in the write enable state, a write pulse is generated in one of first and second write pulse data depending on a logical level of the write data, the first and second write pulse data being fed to a pair of data lines, respectively, comprises: write pulse generating means for forming intermediate write pulse data based on the write control signal and the write data; and data re-input means, inputted with the intermediate write pulse data and the write data, for executing logical operations between the inputted intermediate write pulse data and the inputted write data so as to form final first and second write pulse data which are given to the pair of data lines, respectively, as the foregoing first and second write pulse data.

It may be arranged that the write pulse generating means comprises: a write data pair producing section for forming first and second write data from the write data inputted during the write control signal being in the write enable state; and a write pulse pair generating section for detecting given edges of the first and second write data, respectively, so as to form intermediate first and second write pulse data, and that the data re-input means executes the logical operations between the intermediate first and second write pulse data and the inputted write data, respectively, so as to form the final first and second write pulse data.

It may be arranged that the write pulse generating means comprises: a write control transition detecting section for outputting pulse data when detecting a given edge of the write control signal; a write data transition detecting section for outputting pulse data when detecting a given edge of the write data inputted during the write control signal being in the write enable state; and a pulse data synthesizing section for synthesizing the pulse data from the write control transition detecting section and the pulse data from the write data transition detecting section in a manner to maintain timings of pulses included in those pulse data so as to form the intermediate write pulse data, and that the data re-input means comprises: a first output producing section for executing a first logical operation between the intermediate write pulse data from the pulse data synthesizing section and the inputted write data so as to form the final first write pulse data; and a second output producing section for executing a second logical operation, which is different from the first logical operation, between the intermediate write pulse data from the pulse data synthesizing section and the inputted write data so as to form the final second write pulse data.

It may be arranged that the data input circuit is adapted for plural-bit parallel inputting and the write data is parallel data, and that the write data transition detecting section, the first output producing section and the second output producing section are provided for each bit of the parallel data.

It may be arranged that the write pulse pair generating section detects the given edges of the first and second write data using delay circuits, and that each of the delay circuits is in the form of cascaded inverter gates each having a transition characteristic at a leading edge and a transition characteristic at a trailing edge which are different from each other.

It may be arranged that the write control transition detecting section and the write data transition detecting section detect the given edges of the write control signal and the write data using delay circuits, respectively, and that each of the delay circuits is in the form of cascaded inverter gates each having a transition characteristic at a leading edge and a transition characteristic at a trailing edge which are different from each other.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings.

(First Embodiment)

Figure 1:
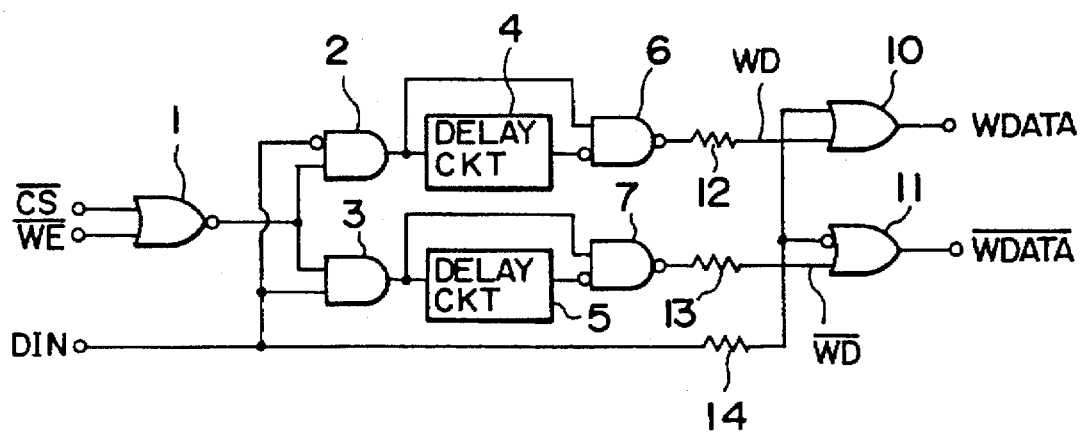
FIG. 1 is a block diagram showing a data input circuit of a semiconductor storage device according to a first preferred embodiment of the present invention.

FIG. 1 shows a structure of a data input circuit of a semiconductor storage device according to a first preferred embodiment of the present invention. In FIG. 1, the same signs or symbols represent the same or like components shown in FIG. 8.

Figure 8:
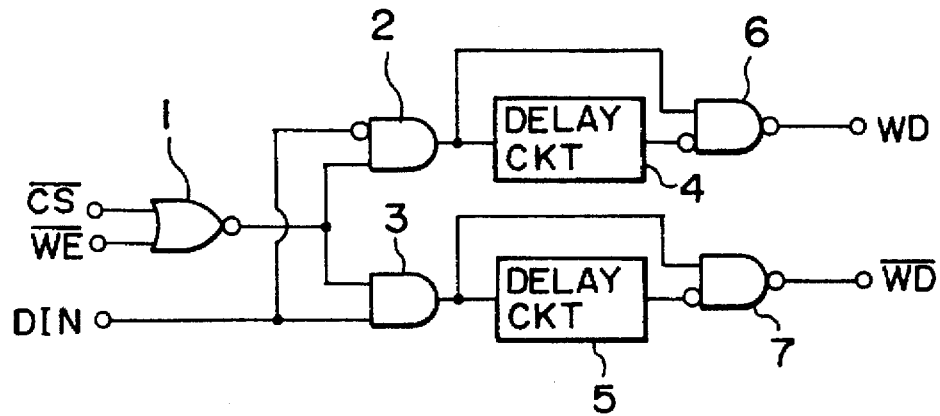
FIG. 8 is a block diagram showing a data input circuit of a conventional semiconductor storage device.

As shown in FIG. 1, the data input circuit of the semiconductor storage device according to the first preferred embodiment further includes, as compared with the conventional data input circuit shown in FIG. 8, two-input OR gates 10 and 11 for shaping the foregoing first and second write pulse data WD and WE)/, respectively. It is preferable to provide these OR gates 10 and 11 forming a pulse shaping section as close to the memory cells as possible. In FIG. 1, numerals 12 to 14 represent wiring-pattern loads including resistance and capacitance components which adversely affect pulse shapes of the first and second write pulse data WD and WD/ and the input data DIN, respectively.

The first write pulse data WD outputted from the NAND gate 6 is directly inputted to one of input terminals of the OR gate 10 through the wiring pattern, while the input data DIN is directly inputted to the other input terminal of the OR gate 10 through the wiring pattern. Accordingly, an OR output between the first write pulse data WD and the input data DIN is derived from the OR gate 10 as final first write pulse data WDATA.

On the other hand, the second write pulse data WD/ outputted from the NAND gate 7 is directly inputted to one of input terminals of the OR gate 11 through the wiring pattern, while the input data DIN is inverted after passing through the wiring pattern and then inputted to the other input terminal of the OR gate 11. Accordingly, an OR output between the second write pulse data WD/ and an inverted signal DIN/ of the input data DIN is derived from the OR gate 11 as final second write pulse data WDATA/.

The OR gates 10 and 11 achieve the pulse shaping functions for the corresponding write pulse data WD and WD/ as described above by combining the logical levels of the corresponding write pulse data WD and WD/ and the input data DIN. The pulse shaping functions are particularly effective in case the logical level of the input data DIN changes during one writing operation period.

Figure 9:
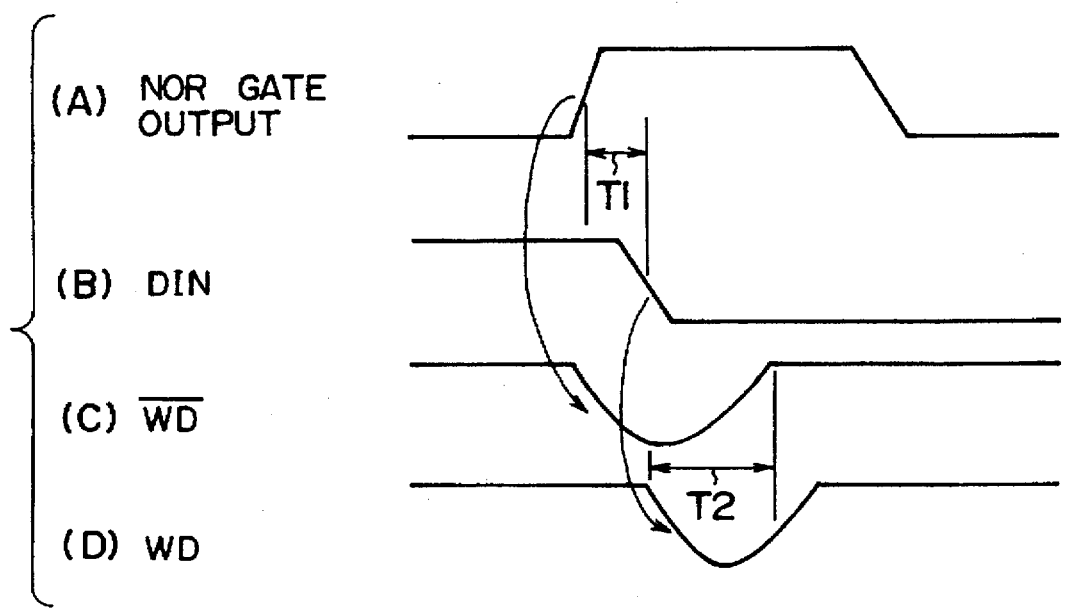
FIG. 9 is a timing chart for explaining a drawback caused by the conventional data input circuit shown in FIG. 8.

Hereinbelow, further explanation will be given with reference to FIG. 2 corresponding to FIG. 9.

Figure 2:
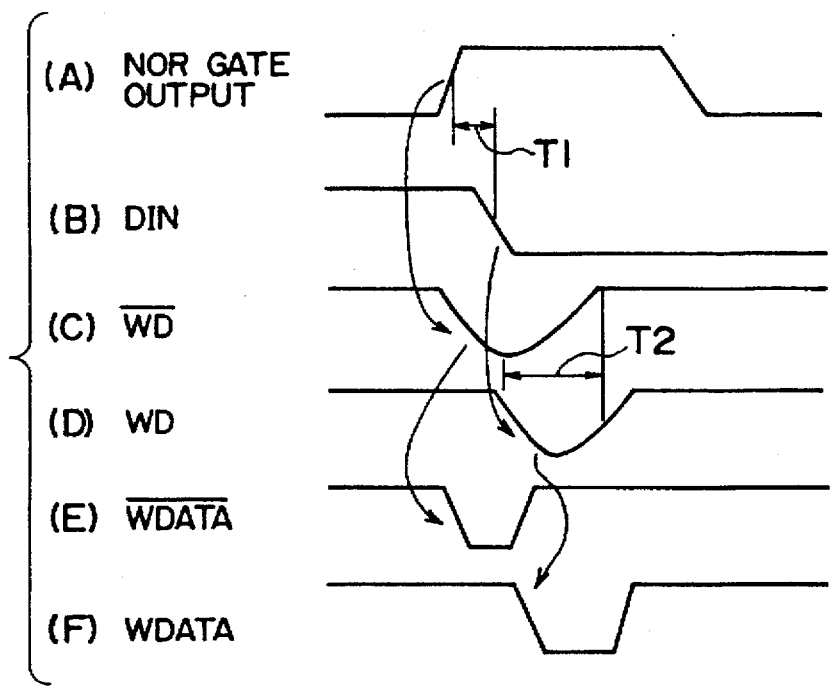
FIG. 2 is a timing chart for explaining an operation of the data input circuit shown in FIG. 1.

In the figure, as shown at (A) and (B) in FIG. 2, the input data DIN is "H" when the output signal of the NOR gate 1 changes to "H" to allow writing of the input data, that is, when the write enable signal WE/ changes to "L" while the chip select signal CS/ is "L". Thus, as shown at (C) in FIG. 2, a pulse is generated only in the second write pulse data WD/ for writing the input data "H" in a memory cell. As further shown at (B) in FIG. 2, the input data DIN changes from "H" to "L" at a time point with a lapse of a relatively short time T1 from a time point where the output of the NOR gate 1 changes to "H", that is, where the write enable signal WE/ changes to "L". Thus, as shown at (D) in FIG. 2, a pulse is generated only in the first write pulse data WD for writing the input data "L" in a memory cell. However, as described before, the pulses in the write pulse data WD and WD/ are subjected to rounding or overlapping due to the timing deviation caused by difference in number of the gates in the pulse-forming circuits or the loads of the wiring pattern for transmitting the first and second write pulse data WD and WD/.

In the high-speed semiconductor storage device having a cycle time of 20 ns or 25 ns, a pulse width is set to a short time of about 5 ns for reducing a write time and ensuring a reading operation immediately after the writing, that is, ensuring a write recovery margin. Thus, an overlap time of the pulses due to delay caused by the wiring-pattern loads or the like is liable to increase relatively.

On the other hand, since the pulse is generated in the second write pulse data WD/ only when the logical level of the input data DIN is "H", if the OR output between the second write pulse data WD/ and the inverted signal of the input data DIN is derived as the final second write pulse data WDATA/ as in this preferred embodiment, the pulse in the second write pulse data WD/ is shaped into a pulse which is "L" during the input data DIN being "H", as shown at (E) in FIG. 2. Similarly, since the pulse is generated in the first write pulse data WD/ only when the logical level of the input data DIN is "L", if the OR output between the first write pulse data WD/ and the input data DIN is derived as the final first write pulse data WDATA/ as in this preferred embodiment, the pulse in the first write pulse data WD/ is shaped into a pulse which is "L" during the input data DIN being "L", as shown at (F) in FIG. 2.

As a result, even if the pulse in the second write pulse data WD/ and the pulse in the first write pulse data WD overlap with each other, the pulse in the final second write pulse data WDATA/ and the pulse in the final first write pulse data WDATA do not overlap or coincide with each other, that is, those pulses are separated from each other on a time basis. Further, since the OR outputs, that is, the final first and second write pulse data WDATA and WDATA/, are derived using the input data DIN which is free of influences of the number of gates or the like and after passing through the wiring patterns, the waveforms of the final write pulse data WDATA and WDATA/ are made clear or definite.

On the other hand, if the input data DIN is "L" when the write enable signal WE/ changes to "L" during the chip select signal CS/ being "L" and further if the input data DIN changes from "L" to "H" at a time point with a lapse of a relatively short time from a time point where the write enable signal WE/ changes to "L", the pulses in the final first and second write pulse data WDATA and WDATA/ are separated from each other on a time basis by means of an operation similar to the foregoing, and thus, the waveforms thereof are also made clear or definite.

As appreciated, if the logical level of the input data DIN changes in plural times while the chip select signal CS/ and the write enable signal WE/ are both "L", the foregoing operation is achieved at every change in logical level.

In this preferred embodiment, the delay circuits 4 and 5 differ in structure from those shown in FIG. 8 so as to obtain the excellent final write pulse data WDATA and WDATA/ even when the logical level of the input data DIN changes for a short time due to noise or the like during one writing operation period.

In general, the conventional delay circuit is in the form of logical elements, such as inverter gates, NAND gates, NOR gates or the like, in a simple cascade connection or in the form of resistors, capacitors and the like. Even in the former case, no attention is paid to a structure of each logical element.

Figure 3:
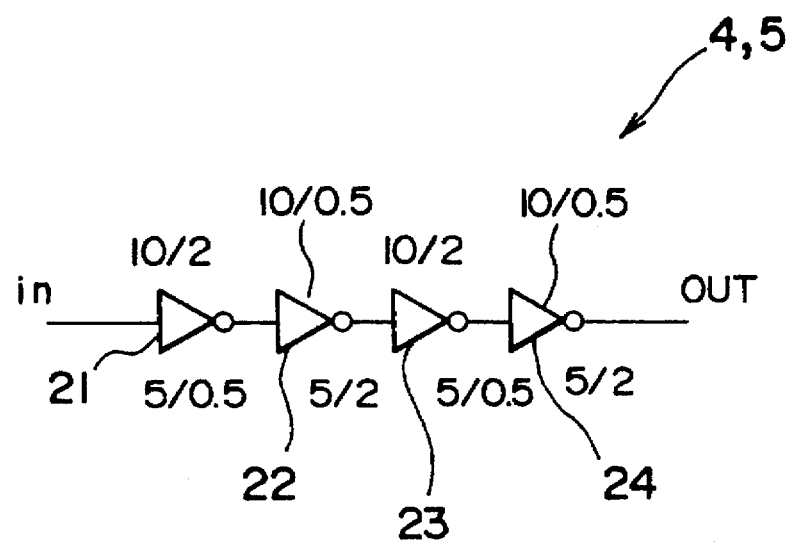
FIG. 3 is a block diagram showing a structure of a delay circuit shown in FIG. 1.

On the other hand, in this preferred embodiment, as shown in FIG. 3, each of the delay circuits 4 and 5 is constituted by C-MOS inverter gates 21 to 24 including P-MOS's and N-MOS's and having different characteristics.

Each of the first and third stage inverter gates 21 and 23 has a ratio $W_p/L_p$ of 10 μm/2 μm ($W_p$=P-MOS gate width, $L_p$=P-MOS gate length) which determines a transition time from "L" to "H", and a ratio $W_n/L_n$ of 5 μm/0.5 μm ($W_n$=N-MOS gate width, $L_n$=N-MOS gate length) which determines a transition time from "H" to "L". On the other hand, each of the second and fourth stage inverter gates 22 and 24 has a ratio $W_p/L_p$ of 10 μm/0.5 μm and a ratio $W_n/L_n$ of 5 μm/2 μm.

Specifically, each of the first and third stage inverter gates 21 and 23 requires a longer time for a transition from "L" to "H" than from "H" to "L", while each of the second and fourth stage inverter gates 22 and 24 requires a longer time for a transition from "H" to "L" than from "L" to "H". However, seeing from the input data of the delay circuit 4 or 5, each of the second and fourth stage inverter gates 22 and 24 which receives the inverted input data has the same edge transition characteristic as that of the first or third stage inverter gate 21 or 23. Specifically, seeing from the edges of the input data, all the inverter gates 21 to 24 work to cause a transition time of the leading edge to be longer than a transition time of the trailing edge.

Figure 4:
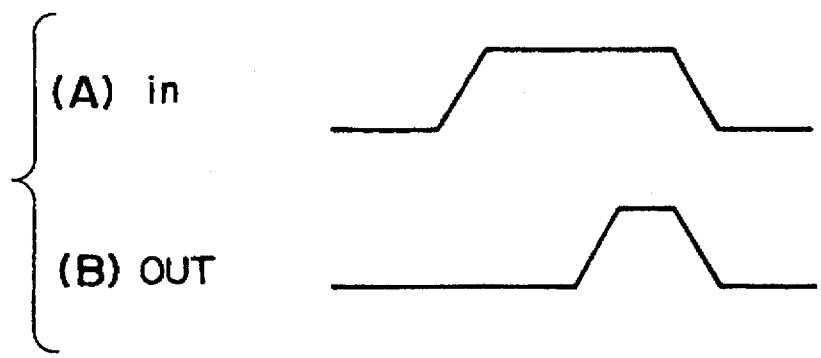
FIG. 4 is a diagram showing waveforms of input and output signals of the delay circuit shown in FIG. 3.

Accordingly, input data having a large pulse width as shown at (A) in FIG. 4 is outputted from the delay circuit 4 or 5 as output data having a short pulse width as shown at (B) in FIG. 4. Thus, if a width of a pulse in the input data is small, it is possible that such a pulse disappears in the output data.

As appreciated, since the transition characteristic of each of the first and third stage inverter gates 21 and 23 and the transition characteristic of each of the second and fourth inverter gates 22 and 24 are symmetrical with each other as described above, a transition time of the leading edge and a transition time of the trailing edge in the output data from the delay circuit 4 or 5 are substantially equal to each other.

Figure 5:
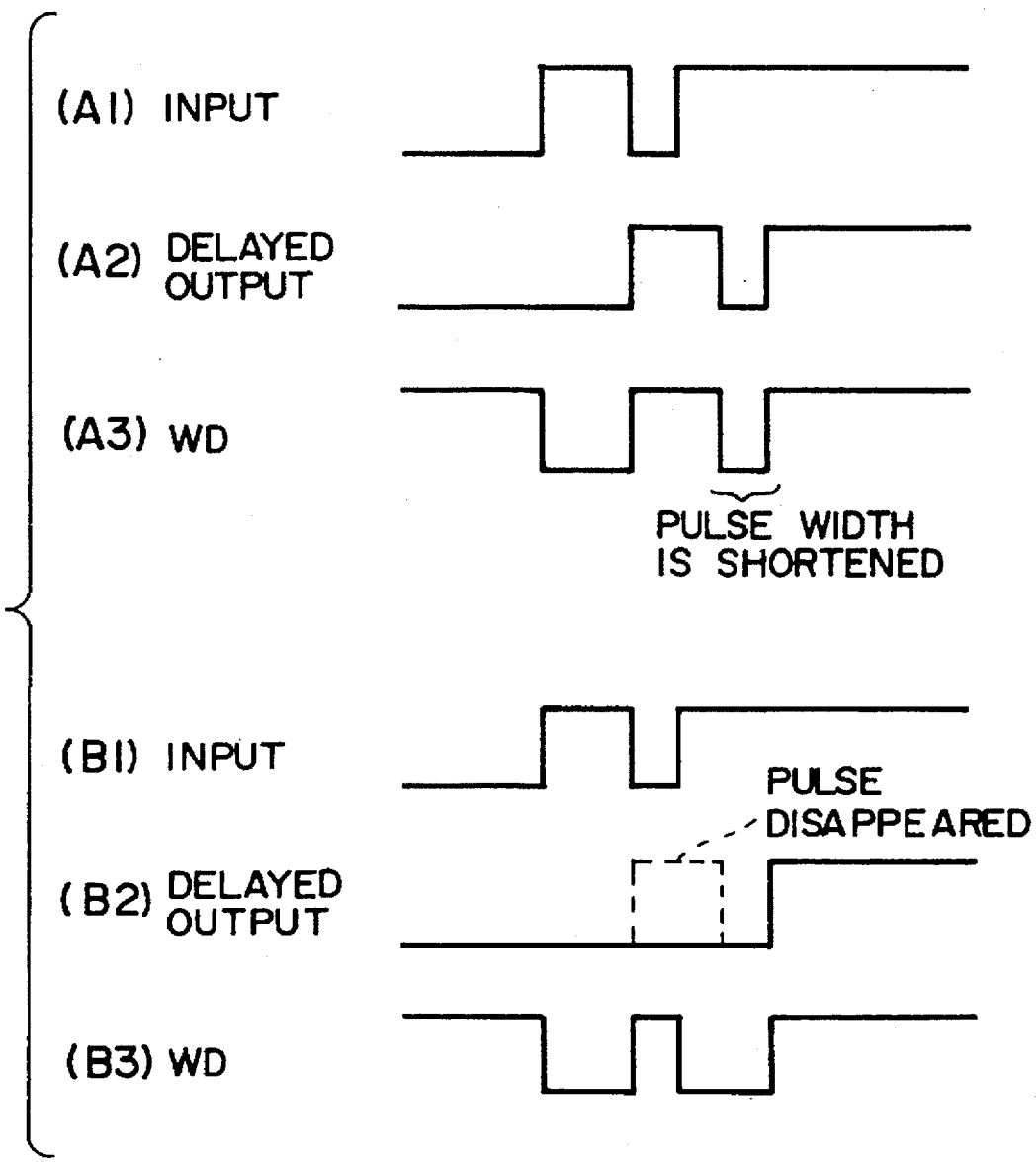
FIG. 5 is a timing chart for explaining an advantage achieved by the delay circuit shown in FIG. 3.

FIG. 5 shows a timing chart for explaining an advantage of using the delay circuits 4 and 5 shown in FIGS. 1 and 3 rather than the conventional delay circuits 4 and 5 shown in FIG. 8. In FIG. 5, (A1) to (A3) relate to an operation of the conventional delay circuit 4, while (B1) to (B3) relate to an operation of the delay circuit 4 according to this is preferred embodiment.

When the conventional delay circuit 4 is used, input data having a short pulse as shown at (A1) in FIG. 5 is delayed by a given time and outputted as it is as shown at (A2) in FIG. 5. As a result, as shown at (A3) in FIG. 5, it is possible that an active pulse with a short pulse width, which can not ensure a writing operation of the memory cell, is generated in the first write pulse data WD from the NAND gate 6.

On the other hand, when the delay circuit 4 shown in FIG. 3 is used, even if input data as shown at (B1) in FIG. 5, which is the same as that shown at (A1) in FIG. 5, is inputted, a short pulse in the input data is removed from output data of the delay circuit 4 as shown at (B2) in FIG. 5. As a result, as shown at (B3) in FIG. 5, an active pulse with a sufficiently long pulse width, which can ensure the writing operation of the memory cell, can be achieved in the first write pulse data WD from the NAND gate 6, rather than the shortened pulse width as shown at (A3) in FIG. 5.

As described above, according to the foregoing first preferred embodiment, the first and second write pulse data are shaped through the logical operation with the input data so as to derive the final first and second write pulse data. Thus, even if the input data changes during the writing operation, the writing pulse corresponding to the level of the input data after the change can be obtained with a sufficient pulse width and an excellent pulse shape so that the data can be correctly written in the memory cell.

Further, according to the foregoing first preferred embodiment, the delay circuit is in the form of the cascaded C-MOS inverter gates including the P-MOS's and the N-MOS's and having the symmetrical transition characteristics. Thus, even if the short pulse is generated in the input data of the delay circuit due to the influence of noise or the like, the writing pulse which can normally operate the memory cell can be achieved by removing such an influence.

Since the pulses in the final first and second write pulse data are separated from each other on a time basis, and further, the waveforms thereof are excellent, resetting of the data lines or bit lines by means of a reset circuit (not shown) can be achieved reliably at high speed so that the subsequent reading operation can also be achieved reliably at high speed.

(Second Embodiment)

Figure 6:
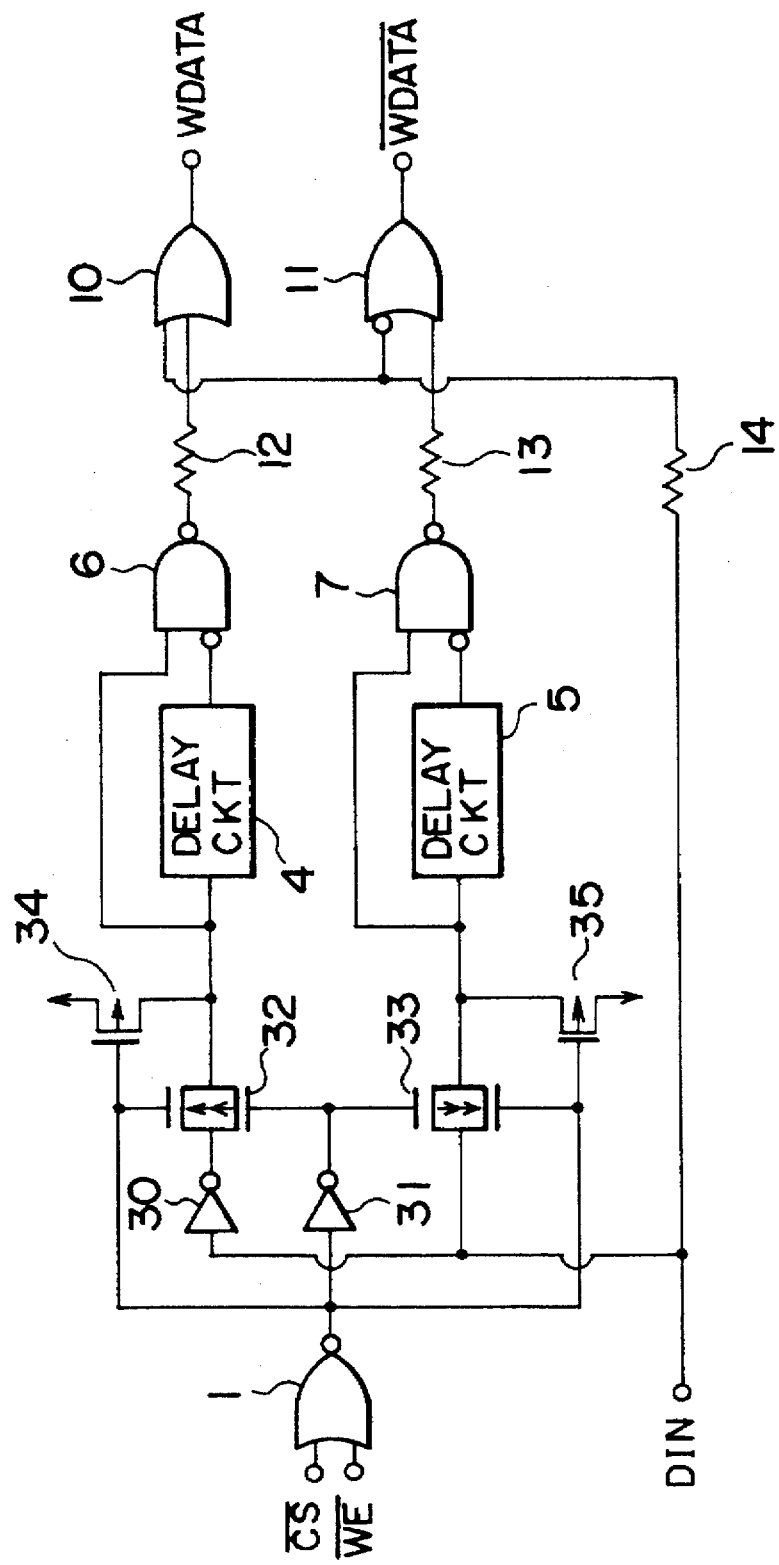
FIG. 6 is a block diagram showing a data input circuit of a semiconductor storage device according to a second preferred embodiment of the present invention.

FIG. 6 shows a structure of a data input circuit of a semiconductor storage device according to a second preferred embodiment of the present invention. In FIG. 6, the same signs or symbols represent the same or like components shown in FIG. 1.

As shown in FIG. 6, the AND gates 2 and 3 shown in FIG. 1 are replaced by another arrangement in the second preferred embodiment. Since the AND gates 2 and 3 work as gate means (switch means) for passing therethrough the inverted signal of the input data DIN and the input data DIN, respectively, when the chip select signal CS/ and the write enable signal WE/ are both active, they can be replaced by an arrangement employing transfer gates.

In FIG. 6, two inverter gates 30 and 31, a transfer gate 32 and a P-MOS 34 correspond to the AND gate 2, while the inverter gate 31, a transfer gate 33 and a P-MOS 35 correspond to the AND gate 3. The P-MOS's 34 and 35 are provided for pulling up voltage levels.

When the chip select signal CS/ and the write enable signal WE/ are both "L" (active), the NOR gate 1 outputs a signal "H". This "H" signal and its inverted signal via the inverter gate 31 are inputted to the transfer gates 32 and 33 to turn them on, while the P-MOS's 34 and 35 are both turned off. In this state, the input data DIN is inverted via the inverter gate 30 and then passes the transfer gate 32 so as to be fed to the delay circuit 4 and the NAND gate 6. Simultaneously, the input data DIN passes the transfer gate 33 so as to be fed to the delay circuit 5 and the NAND gate 7.

On the other hand, when at least one of the chip select signal CS/ and the write enable signal WE/ is "H", the NOR gate 1 outputs a signal "L" so that the transfer gates 32 and 33 are both turned off and the P-MOS's 34 and 35 are both turned on. In this state, the inverted signal of the input data DIN via the inverter gate 30 can not pass the transfer gate 32, and similarly, the input data DIN can not pass the transfer gate 33. On the other hand, a signal "H" is inputted to the delay circuit 4 and the NAND gate 6 due to a function of the pull-up P-MOS 34. Similarly, a signal "H" is inputted to the delay circuit 5 and the NAND gate 7 due to a function of the pull-up P-MOS 35. Accordingly, while the NOR gate 1 outputs the "L" signal, each of the NAND gates 6 and 7 outputs the "H" signal as in the foregoing first preferred embodiment.

Further, in the second preferred embodiment, as in the foregoing first preferred embodiment, the first and second write pulse data are shaped through the logical operation with the input data so as to derive the final first and second write pulse data. Thus, even if the input data changes in the write enable state, the writing pulse corresponding to the level of the input data after the change can be obtained with a sufficient pulse width and an excellent pulse shape so that the data can be correctly written in the memory cell. Further, the delay circuit is in the form of the cascaded C-MOS inverter gates including the P-MOS's and the N-MOS's and having the symmetrical transition characteristics. Thus, even if the short pulse is generated in the input data of the delay circuit due to the influence of noise or the like, the writing pulse which can normally operate the memory cell can be achieved by removing such an influence.

In addition, according to the second preferred embodiment, the wiring pattern area can be further reduced in size. Specifically, for example, when comparing the first and second preferred embodiments in terms of the number of C-MOS's constituting the associated components, the results are as follows: In the first preferred embodiment, the AND gate 2 is constituted by 8 C-MOS's and the AND gate 3 is constituted by 6 C-MOS's, thus 14 C-MOS's in total. On the other hand, in the second preferred embodiment, each of the inverter gates 30 and 31 is constituted by 2 C-MOS's, each of the transfer gates 32 and 33 is constituted by 2 C-MOS's and each of the pull-up P-MOS's 34 and 35 is constituted by 1 C-MOS, thus 10 C-MOS's in total. Accordingly, the number of C-MOS's can be reduced by four in the second preferred embodiment so that the wiring pattern area can also be reduced correspondingly.

(Third Embodiment)

Figure 7:
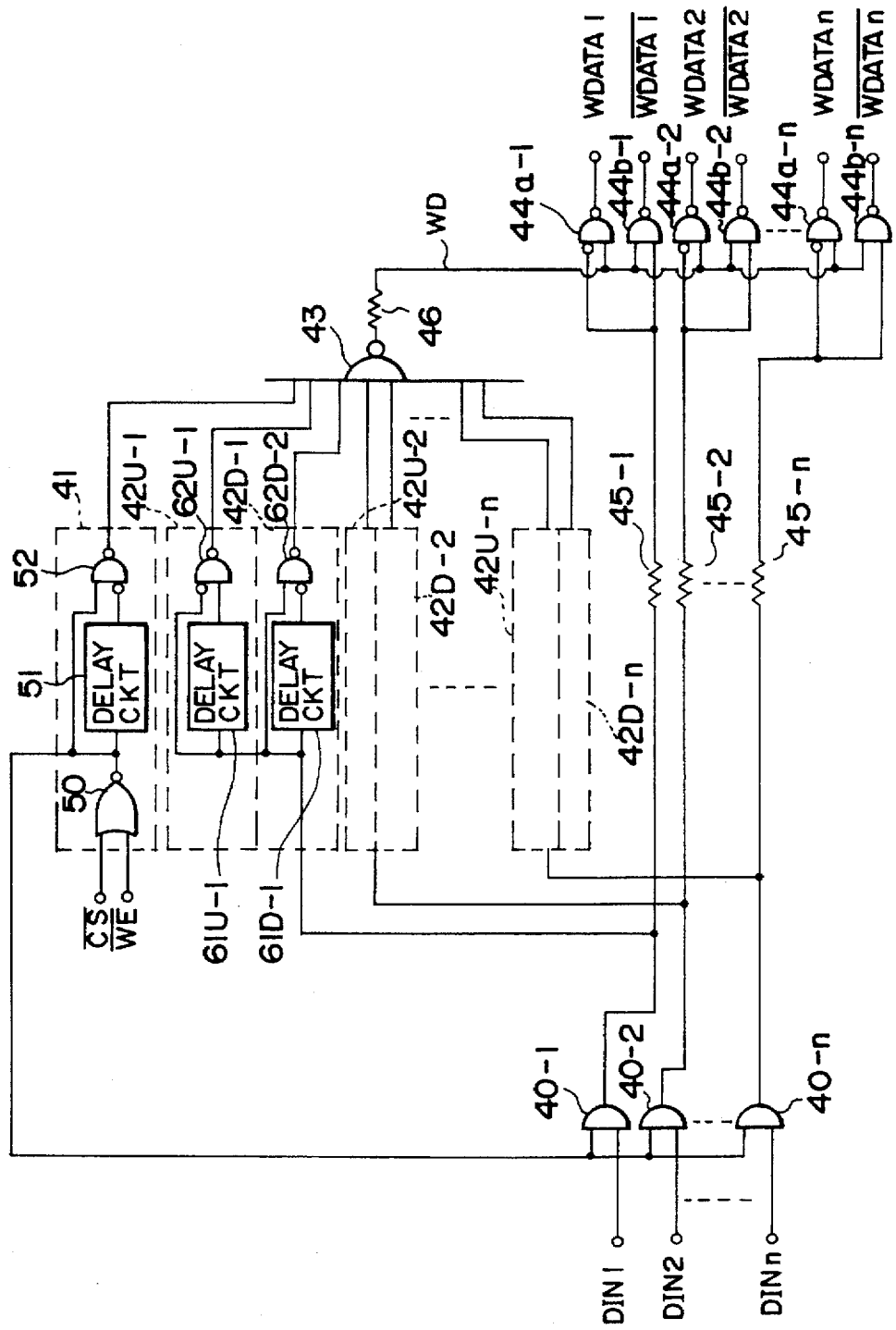
FIG. 7 is a block diagram showing a data input circuit of a semiconductor storage device according to a third preferred embodiment of the present invention.

FIG. 7 shows a structure of a data input circuit of an n-bit parallel input semiconductor storage device according to a third preferred embodiment of the present invention. As appreciated, the data input circuit in the foregoing first or second preferred embodiment can also be adapted for the n-bit parallel inputting.

In FIG. 7, each of input bit data DIN1 ... DINn is inputted to one of input terminals of corresponding one of two-input AND gates 40-1 ... 40-n. To the other terminal of each of the AND gates 40-1 to 40-n is fed an output signal from a NOR gate 50, that is, a NOR output between the chip select signal CS/ and the write enable signal WE/. Thus, each of the AND gates 40-1 to 40-n outputs a signal with a logical level equal to that of the corresponding one of the input bit data DIN1 to DINn when the chip select signal CS/ and the write enable signal WE/ are both "L", and otherwise outputs a signal "L".

As described in the foregoing first preferred embodiment, the write pulse is outputted (1) immediately after the chip select signal CS/ and the write enable signal WE/ both change to "L" (active), or (2) immediately after the input data changes while the chip select signal CS/ and the write enable signal WE/ are both "L".

A write pulse data generating section 41 generates the write pulse data in case of (1), while each of write pulse data generating sections 42U-1, 42D-1 ... 42U-n, 42D-n generates the write pulse data in case of (2).

The write pulse data generating section 41 includes the NOR gate 50, a delay circuit 51 and a two-input NAND gate 52. As described above, the NOR gate 50 derives the NOR output between the chip select signal CS/ and the write enable signal WE/ and thus outputs a signal "H" when the chip select signal CS/ and the write enable signal WE/ are both "L" (active). The output signal from the NOR gate 50 is directly inputted to the delay circuit 51 and the NAND gate 52. An output signal from the delay circuit 51 is inverted and then inputted to the NAND gate 52. With this arrangement, the NAND gate 52 outputs the write pulse data having a level "L" for a given time, as determined by the delay circuit 51, from a time point where the output signal of the NOR gate 50 changes to "H", that is, where the chip select signal CS/ and the write enable signal WE/ both change to "L".

To the write pulse data generating sections 42U-i and 42D-i (i=1 to n), the input bit data DINi passing the corresponding AND gate 40-i is inputted.

All the write pulse data generating sections 42U-1 to 42U-n have the same structure. As shown in the write pulse data generating section 42U-1, the write pulse data generating section 42U-1 includes a delay circuit 61U-i and a two-input NAND gate 62U-i. The input bit data DINi is directly inputted to the delay circuit 61U-i, while inverted and then inputted to the NAND gate 62U-i. An output signal from the delay circuit 61U-i is also inputted to the NAND gate 62U-i. With this arrangement, the NAND gate 62U-i outputs the write pulse data having a level "L" for a given time, as determined by the delay circuit 61U-i, from a time point where the input bit data DIN1 changes from "H" to "L".

All the write pulse data generating sections 42D-1 to 42D-n have the same structure. As shown in the write pulse data generating section 42D-1, the write pulse data generating section 42D-i includes a delay circuit 61D-i and a two-input NAND gate 62D-i. The input bit data DINi is directly inputted to the delay circuit 61D-i and the NAND gate 62D-i. An output signal from the delay circuit 61D-i is inverted and then inputted to the NAND gate 62D-i. With this arrangement, the NAND gate 62D-i outputs the write pulse data having a level "L" for a given time, as determined by the delay circuit 61D-i, from a time point where the input bit data DINi changes from "L" to "H".

The parallel input data change in such a manner that one bit data thereof changes or more bit data thereof simultaneously change. Accordingly, if the write pulse data is outputted from at least one of the write pulse data generating sections 42U-1, 42D-1 ... 42U-n, 42D-n, it represents a time point immediately after the parallel input data have changed during the writing period, taking into consideration the functions of the AND gates 40-1 to 40-n.

The write pulse data from all the write pulse data generating sections 41, 42U-1, 42D-1 ... 42U-n, 42D-n are fed to a 2n+1-input NAND gate 43. With this arrangement, the NAND gate 43 outputs common write pulse data WD having a level "H" for the given time immediately after the chip select signal CS/ and the write enable signal WE/ both change to "L" (active), or immediately after the parallel input data change during the writing period. The common write pulse data WD is given to one of input terminals of each of all the two-input NAND gates 44a-1, 44b-1 ... 44a-n, 44b-n provided at the output stage of the data input circuit.

To the other input terminal of the NAND gate 44a-i for outputting the first write pulse data is inputted the input bit data DINi passing the corresponding AND gate 40-i and then inverted. With this arrangement, when the input bit data DINi is "L" and the common write pulse data WD with its active level "H" is inputted, the NAND gate 44a-i outputs a signal having a level "L" with a pulse width corresponding to that of the active "H" level of the common write pulse data WD. The output signal from the NAND gate 44a-i is sent out as a final first write pulse data WDATAi corresponding to the input bit data DINi.

On the other hand, to the other input terminal of the NAND gate 44b-i for outputting the second write pulse data is directly inputted the input bit data DINi passing the corresponding AND gate 40-i. With this arrangement, when the input bit data DINi is "H" and the common write pulse data WD with its active level "H" is inputted, the NAND gate 44b-i outputs a signal having a level "L" with a pulse width corresponding to that of the active "H" level of the common write pulse data WD. The output signal from the NAND gate 44b-i is sent out as a final second write pulse data WDATAi/ corresponding to the input bit data DINi.

Since the input bit data DINi is inverted and then inputted to one of the pair of NAND gates 44a-i and 44b-i while directly inputted to the other of them, the final first and second write pulse data WDATAi and WDATAi/ are prevented from both becoming "L" simultaneously.

According to the third preferred embodiment, immediately after the chip select signal CS/ and the write enable signal WE/ both become "L" or immediately after the parallel input data change during the writing period where the chip select signal CS/ and the write enable signal WE/ are both "L", the "L" write pulse is generated in one of the first and second write pulse data WDATAi and WDATAi/ depending on the logical level of the input bit data DINi.

If the parallel input data change at a time point with a lapse of a relatively short time from a time point where the chip select signal CS/ and the write enable signal WE/ both become "L", it is possible that the first write pulse from the write pulse data generating section 41 and the subsequent write pulse from one of the write pulse data generating sections 42U-1, 42D-1 ... 42U-n, 42D-n become continuous with each other so that the NAND gate 43 outputs the write pulse having a large pulse width. However, by means of the pair of NAND gates 44a–i and 44b–i inputted with the input bit data DINi, the continuous pulse is separated from each other on a time basis.

In FIG. 7, symbols 45-1 to 45-n and 46 represent wiring-pattern loads including resistance and capacitance components which adversely affect the shapes of the transmitted signals.

As described above, according to the third preferred embodiment, as in the foregoing first or second preferred embodiment, the first and second write pulse data are shaped through the logical operation with the input data so as to derive the final first and second write pulse data. Thus, even if the input data changes in the write enable state, the writing pulse corresponding to the level of the input data after the change can be obtained with a sufficient pulse width and an excellent pulse shape so that the data can be correctly written in the memory cell.

Further, in the third preferred embodiment, if each delay circuit has the structure as shown in FIG. 3, even when the short pulse is generated in the input data of the delay circuit due to the influence of noise or the like, the writing pulse which can normally operate the memory cell can be achieved by removing such an influence.

Further, according to the third preferred embodiment, the write pulse data are formed commonly relative to all input bit data, and the formation of the first and second write pulse data for each bit and the shaping thereof are achieved by the logical elements of the same kinds. Thus, the structure reflected on the wiring pattern region or the like can be reduced in size.

When adapting the first or second preferred embodiment for the n-bit parallel inputting, the wiring patterns are required for each bit to transmit the input data DIN and the write pulse data WD and WD/ to the pulse shaping section. Thus, 3×n wiring patterns are necessary for all the bits. On the other hand, in the third preferred embodiment, since the wiring patterns are required for transmitting the respective bit data and the common write pulse data to the pulse shaping section, only n+1 wiring patterns are required for all the bits. Thus, the wiring pattern area is reduced, and thus, the chip area can also be reduced.

The data input circuit according to the third preferred embodiment is adapted for the plural-bit parallel inputting, but may be adapted for one-bit inputting.

While the present invention has been described in terms of the preferred embodiments, the invention is not to be limited thereto, but can be embodied in various ways without departing from the principle of the invention as defined in the appended claims.

For example, the present invention can be applied not only to the semiconductor storage device as an independent unit, but also to a semiconductor storage section incorporated in a semiconductor integrated circuit of a microcomputer or the like. Thus, the present invention is also applicable to those memory cells working as a register. Further, the active levels of various data are not limited to those in the foregoing preferred embodiments, and types of logical gates to be used may be selected depending on an active level of the corresponding data.

What is claimed is:

1. A data input circuit of a semiconductor storage device, wherein when a write control signal is changed to a write enable state or when write data changes during the write control signal being in said write enable state, a write pulse is generated in one of first and second write pulse data depending on a logical level of said write data, said first and second write pulse data being fed to a pair of data lines, respectively, said data input circuit comprising:

write pulse generating means for forming intermediate write pulse data based on said write control signal and said write data; and data re-input means, inputted with said intermediate write pulse data and said write data, for executing logical operations between said inputted intermediate write pulse data and said inputted write data so as to form final first and second write pulse data which are given to the pair of data lines, respectively, as said first and second write pulse data.

2. The data input circuit according to claim 1, wherein said write pulse generating means comprises:

a write data pair producing section for forming first and second write data from said write data inputted during said write control signal being in the write enable state; and a write pulse pair generating section for detecting given edges of said first and second write data, respectively, so as to form intermediate first and second write pulse data, and wherein said data re-input means executes the logical operations between said intermediate first and second write pulse data and said inputted write data, respectively, so as to form said final first and second write pulse data.

3. The data input circuit according to claim 1, wherein said write pulse generating means comprises:

a write control transition detecting section for outputting pulse data when detecting a given edge of said write control signal;

a write data transition detecting section for outputting pulse data when detecting a given edge of said write data inputted during said write control signal being in the write enable state; and a pulse data synthesizing section for synthesizing the pulse data from said write control transition detecting section and the pulse data from said write data transition detecting section in a manner to maintain timings of pulses included in those pulse data so as to form said intermediate write pulse data, and wherein said data re-input means comprises:

a first output producing section for executing a first logical operation between said intermediate write pulse data from the pulse data synthesizing section and said inputted write data so as to form said final first write pulse data; and a second output producing section for executing a second logical operation, which is different from said first logical operation, between said intermediate write pulse data from the pulse data synthesizing section and said inputted write data so as to form said final second write pulse data.

4. The data input circuit according to claim 3, wherein said data input circuit is adapted for plural-bit parallel inputting and said write data is parallel data, and wherein said write data transition detecting section, said first output producing section and said second output producing section are provided for each bit of said parallel data.

5. The data input circuit according to claim 2, wherein said write pulse pair generating section detects the given edges of said first and second write data using delay circuits, and wherein each of said delay circuits is in the form of cascaded inverter gates each having a transition characteristic at a leading edge and a transition characteristic at a trailing edge which are different from each other.

6. The data input circuit according to claim 3, wherein said write control transition detecting section and said write data transition detecting section detect the given edges of said write control signal and said write data using delay circuits, respectively, and wherein each of said delay circuits is in the form of cascaded inverter gates each having a transition characteristic at a leading edge and a transition characteristic at a trailing edge which are different from each other.

* * * * *